(12) United States Patent
Chou et al.

(10) Patent No.: US 8,872,686 B2
(45) Date of Patent: Oct. 28, 2014

(54) LOW GLITCH CURRENT DIGITAL-TO-ANALOG CONVERTER

(71) Applicant: Taiwan Semiconductor Manufacturing Co., Ltd., Hsin-Chu (TW)

(72) Inventors: Kuo-Yu Chou, Hsinchu (TW); Wei Lun Tao, Hsinchu (TW); Shang-Fu Yeh, Hsinchu (TW); Yi-Che Chen, Taichung (TW); Calvin Yi-Ping Chao, Zhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 13/858,445

(22) Filed: Apr. 8, 2013

(65) Prior Publication Data

US 2014/0266831 A1    Sep. 18, 2014

Related U.S. Application Data

(60) Provisional application No. 61/781,880, filed on Mar. 14, 2013.

(51) Int. Cl.
*H03M 1/66* (2006.01)
*H03M 1/72* (2006.01)

(52) U.S. Cl.
CPC ...................................... *H03M 1/72* (2013.01)
USPC ............ 341/144; 327/231; 365/171; 365/158; 365/175; 365/203; 341/146; 341/148; 341/150

(58) Field of Classification Search
CPC ....... H03M 1/66; H03M 1/685; H03M 1/687; H03M 1/747; H03M 1/662; H01L 27/11546; H03K 19/177; G11C 11/15; G11C 11/16; G11C 8/00; G11C 8/12; G11C 8/18; G11C 7/12; G11C 7/1021; G11C 7/1075; G11C 13/0023; G11C 13/0032; G11C 13/0064; G11C 16/0433
USPC ........... 341/130–150; 327/231; 365/171, 158, 365/175, 203, 189.08, 230.04, 230.03, 365/185.18, 185.05
See application file for complete search history.

(56) References Cited

U.S. PATENT DOCUMENTS

| | | | | |
|---|---|---|---|---|
| 5,293,347 A * | 3/1994 | Ogawa | ...................... | 365/230.01 |
| 5,493,535 A * | 2/1996 | Cho | ...................... | 365/230.04 |
| 5,574,455 A * | 11/1996 | Hori et al. | ...................... | 341/144 |
| 5,929,798 A * | 7/1999 | Baek | ...................... | 341/153 |
| 6,191,972 B1 * | 2/2001 | Miura et al. | ................... | 365/171 |
| 7,075,851 B2 * | 7/2006 | Tanaka | ...................... | 365/230.06 |

(Continued)

*Primary Examiner* — Lam T Mai
(74) *Attorney, Agent, or Firm* — Eschweiler & Associates, LLC

(57) ABSTRACT

The present disclosure relates to a method and architecture to minimize a transient glitch within a current digital-to-analog converter (DAC) comprising an array of identical current unit cells. The current DAC is configured with individual column decoders for even and odd rows of current unit cells, thus allowing for independent control of adjacent rows. The even row and odd row column decoders further comprise thermal decoders with coupled timing encoding which establishes synergy between an adjacent pair of rows. As current units cells within an active row are activated across the row by a counting up of a first column decoder, the current units cells within a next row adjacent the active row are returned to an initial state of the active row by counting down in a second column decoder. Other devices and methods are also disclosed.

20 Claims, 12 Drawing Sheets

(56) References Cited

U.S. PATENT DOCUMENTS

| | | | |
|---|---|---|---|
| 8,089,808 B2 * | 1/2012 | Torii | 365/185.05 |
| 8,111,573 B2 * | 2/2012 | Ishihara et al. | 365/218 |
| 8,184,029 B1 * | 5/2012 | Hsieh et al. | 341/144 |
| 2012/0163089 A1 * | 6/2012 | Saeki | 365/185.18 |

* cited by examiner

300A

300B

| Y[I] | X[j] | X[j+1] | OUT |
|---|---|---|---|
| 0 | 0 | 0 | 0 |
| 0 | 1 | 0 | 0 |
| 1 | 0 | 0 | 0 |
| 0 | 1 | 1 | 1 |
| 1 | 1 | 0 | 1 |
| 1 | 1 | 1 | 1 |

Inputs which activate the unit cell

| S | $I_0$ | $I_1$ | Z |
|---|---|---|---|
|   |   | 1 | 1 |
|   | 1 | 0 | 1 |
|   |   | 1 | 0 |
| 0 | 0 | 0 | 0 |
|   |   | 1 | 1 |
|   | 1 | 0 | 0 |
|   |   | 1 | 1 |
| 1 | 0 | 0 | 0 |

US 8,872,686 B2

LOW GLITCH CURRENT DIGITAL-TO-ANALOG CONVERTER

CROSS REFERENCE TO RELATED APPLICATIONS

This application is a Non-provisional application claiming priority to U.S. Provisional Patent Application Ser. No. 61/781,880 filed on Mar. 14, 2013 in the name of Kuo-Yu Chou, et al., entitled "A Low Glitch Current Digital-To-Analog Converter" and is hereby incorporated by reference.

BACKGROUND

Digital-to-analog converters (DACs) are commonly used in microelectronics applications such as digital music players to generate an audio signal from a digital signal, and in televisions and mobile video devices to display colors and shades from a converted digital signal. A thermometer-coded current DAC comprises an equivalent current-source for each value of DAC output.

DETAILED DESCRIPTION

Figure 1A:
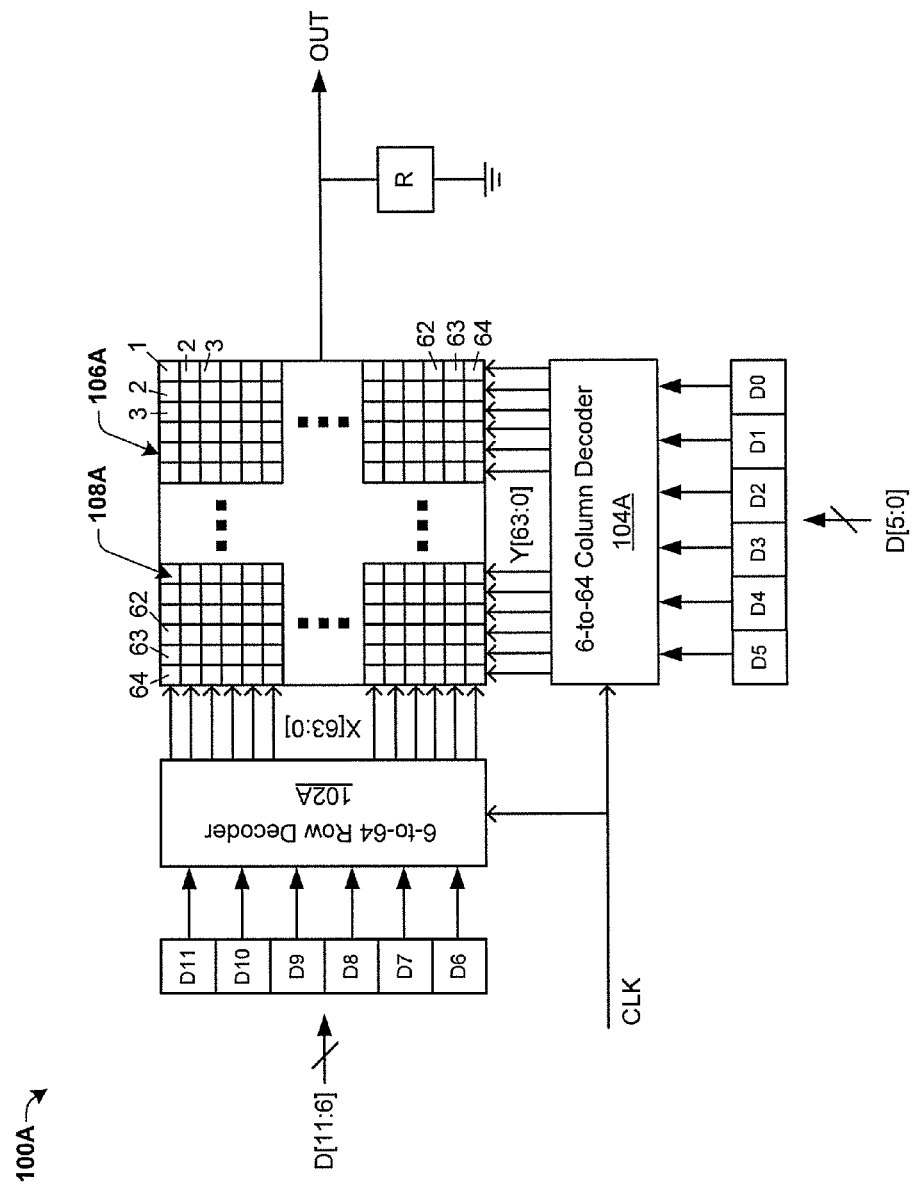
FIG. 1A illustrates an exemplary current digital-to-analog converter (DAC) comprising a row decoder and a column decoder.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates an exemplary current digital-to-analog converter (DAC) 100A configured to receive a 12-bit binary input digital signal D[11:0], and comprising a row decoder 102A, a column decoder 104A, and a cell array 106A which comprises $2^{12}$ (i.e., 64×64=4,096) current unit cells 108A. The row decoder 102A and the column decoder 104A provide control signals in the form of row and column thermometer encoded control signals, X[63:0] and Y[63:0], respectively, and comprise a 6-to-64 thermal decoder, configured to receive 6 bits of binary digital data, and produce a 64 control bits each. For the exemplary current DAC 100A, the input digital signal D[11:0] is split between a most significant bit (MSB) signal D[11:6] (also denoted by blocks D11-D6) and a least significant bit signal LSB signal D[5:0] (also denoted by blocks D5-D0). The MSB signal D[11:6] is sent to the row decoder 102A, and the LSB signal D[5:0] is sent to the column decoder 104A.

When activated by one or more control signals from the row decoder 102A and the column decoder 104A, a current source within a respective current unit cell 108A outputs a predetermined current, wherein the predetermined current output by a respective current unit cell 108A is the same as that of each other current unit cell 108A. These currents from any individual activated current unit cells 108A are summed to generate an analog output current OUT. The number of activated current unit cells 108A in cell array 106A depends on the 12-bit binary input digital signal D[11:0]. For example, if a digital value of 000000000000 (corresponding to a decimal value of zero) is set for D[11:0], then only one current unit cell 108A in cell array 106A is activated and the output current OUT is one unit of current. On the other hand, if all bits are set to 1 (i.e., D0-D11 are set to a digital value of 111111111111, corresponding to a decimal value of 4,095), then all current unit cells 108A in cell array 106A are activated to yield an output signal OUT which essentially is 4,096 times stronger than the output of a single current unit cell 108A.

Figure 1B:
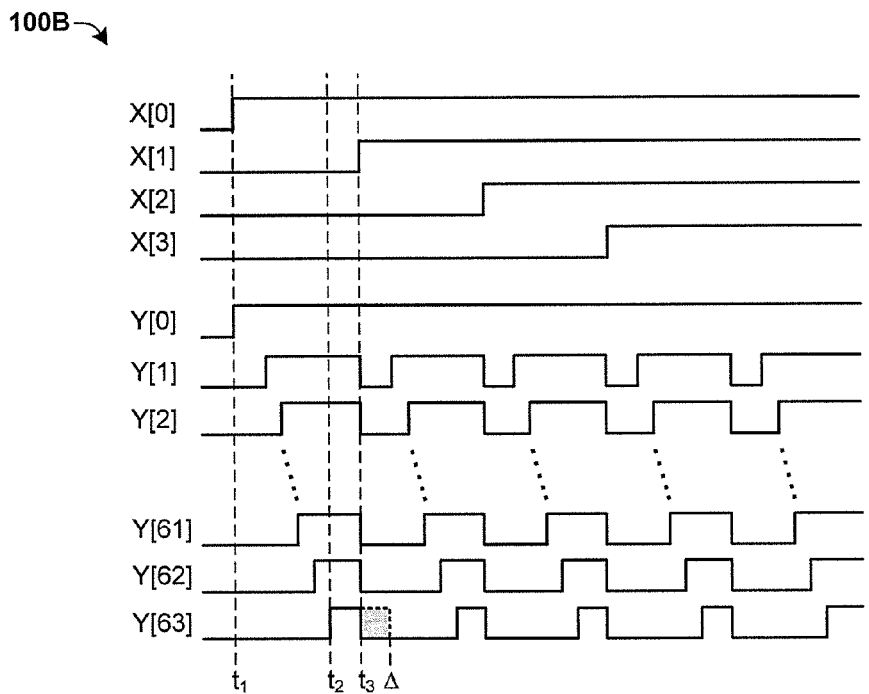
FIG. 1B illustrates a timing diagram corresponding to the DAC of FIG. 1A.

FIG. 1B illustrates a timing diagram 100B corresponding to the current DAC 100A. A first row control signal X[0] acquiring a value of 1 at $t_1$ along with a first column control signal Y[0] acquiring a value of 1 at $t_1$ activates a first current unit cell 108A in the first row of the array. In this sense, a respective current unit cell 108A comprises a value equal to AND(X[0], Y[0]). The thermometer encoding scheme for current DAC 100A activates current unit cells 108A across a respective row before transitioning to the next row. At $t_2$ a sixty-fourth column control signal Y[63] acquires a value of 1, activating a sixty-fourth and final current unit cell 108A in the first row of the array. When transitioning from the first row to the second row, the current unit cells 108A across the first row are held active by an additional control signal (e.g., a first row assertion bit, not shown), while the column control signals Y[63:1] are reset to zero, and the second row control signal X[1] acquires a value of 1 at $t_3$. In an ideal system, the timing between the additional control signal (i.e., acquiring a new binary value), the reset of the column control signals Y[63:1], and the second row control signal X[1] acquiring a value of 1 are perfectly aligned such that all signals change instantaneously at exactly $t_3$. In reality, variations in system components such as path length differences between a respective pair of signals, wire delays, impedance mismatch, etc., causes a misalignment between signals, thus degrading timing control. For instance, the a time delay A between the sixty-third column control signal Y[62] and the sixty-fourth column control signal Y[63] may result from delay in voltage propagation across the first row. In a real system such a voltage propagation delay may manifest itself as an approximately systematic offset between any two adjacent column control signals, or from wiring path differences in the physical design of the current DAC 100A.

Figure 1C:
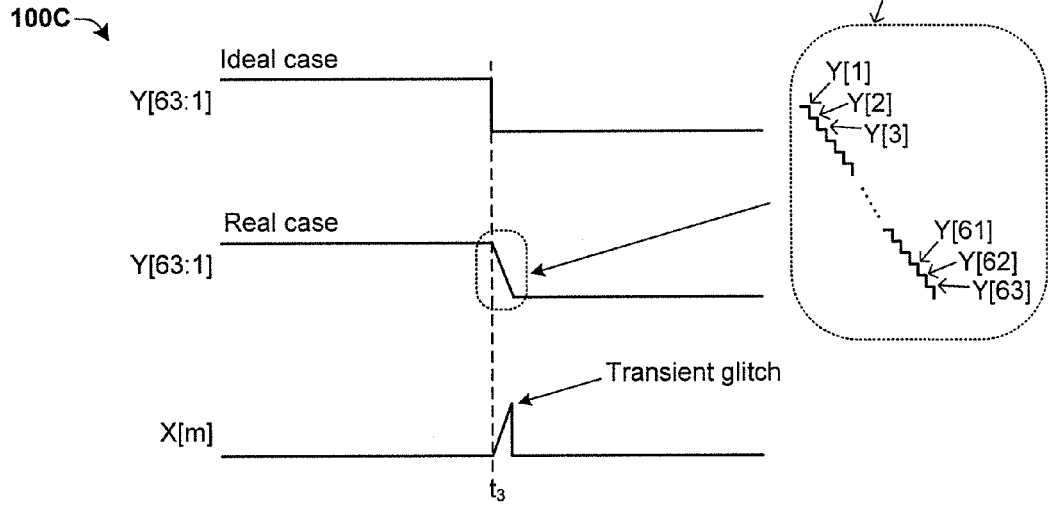
FIG. 1C illustrates an example of timing mismatch in column control signals resulting in a transient glitch in a row control signal.

FIG. 1C illustrates an example of timing mismatch 100C in the column control signals Y[63:1] resulting in a transient glitch in a row control signal. At $t_3$, the column control signals Y[63:1] are reset to zero. In the ideal case, all of these signals reach their respective current unit cells 108A across a $j^{th}$ row of the array 106A at the exact same moment, thus deactivating all of the current unit cells 108A in the $j^{th}$ row at the exact same time ($t_3$) and producing a Heaviside function of $t_3$. In the real case, a timing mismatch between the various column control signals Y[63:1] creates a staggered profile, producing an MSB transient at approximately $t_3$. Because a single row control signal X[j] controls all 64 current unit cells 108A in the $j^{th}$ row, the MSB transient produces a large kickback noise which induces a transient glitch in the row control signal. In some prior art approaches a deglitch cell is added to a respective current unit cell to balance signal timing, wherein the deglitch cell comprises a metal-oxide-semiconductor (MOS) capacitor (CAP). In such approaches timing mismatch must still be addressed along paths wherein a deglitch cell as been added. Additionally MOS CAPs are sensitive to process variation, complicating further a matching of electrical properties (i.e., RC delay) between multiple deglitch cells, and hence timing.

Accordingly, the present disclosure relates to a method and architecture to minimize a transient glitch within a current digital-to-analog converter (DAC) comprising an array of identical current unit cells. The current DAC is configured with individual column decoders for even and odd rows of current unit cells, thus allowing for independent control of adjacent rows. The even row and odd row column decoders further comprise thermal decoders with coupled timing encoding which establishes synergy between an adjacent pair of rows. As current units cells within an active row are activated across the row by a counting up of a first column decoder, the current units cells within a next row adjacent the active row are returned to an initial state of the active row by counting down in a second column decoder. In some embodiments, the current DAC is configured with individual row decoders for even and odd columns of current unit cells, thus allowing for independent control of adjacent columns in a similar manner. Other devices and methods are also disclosed.

Figure 2:
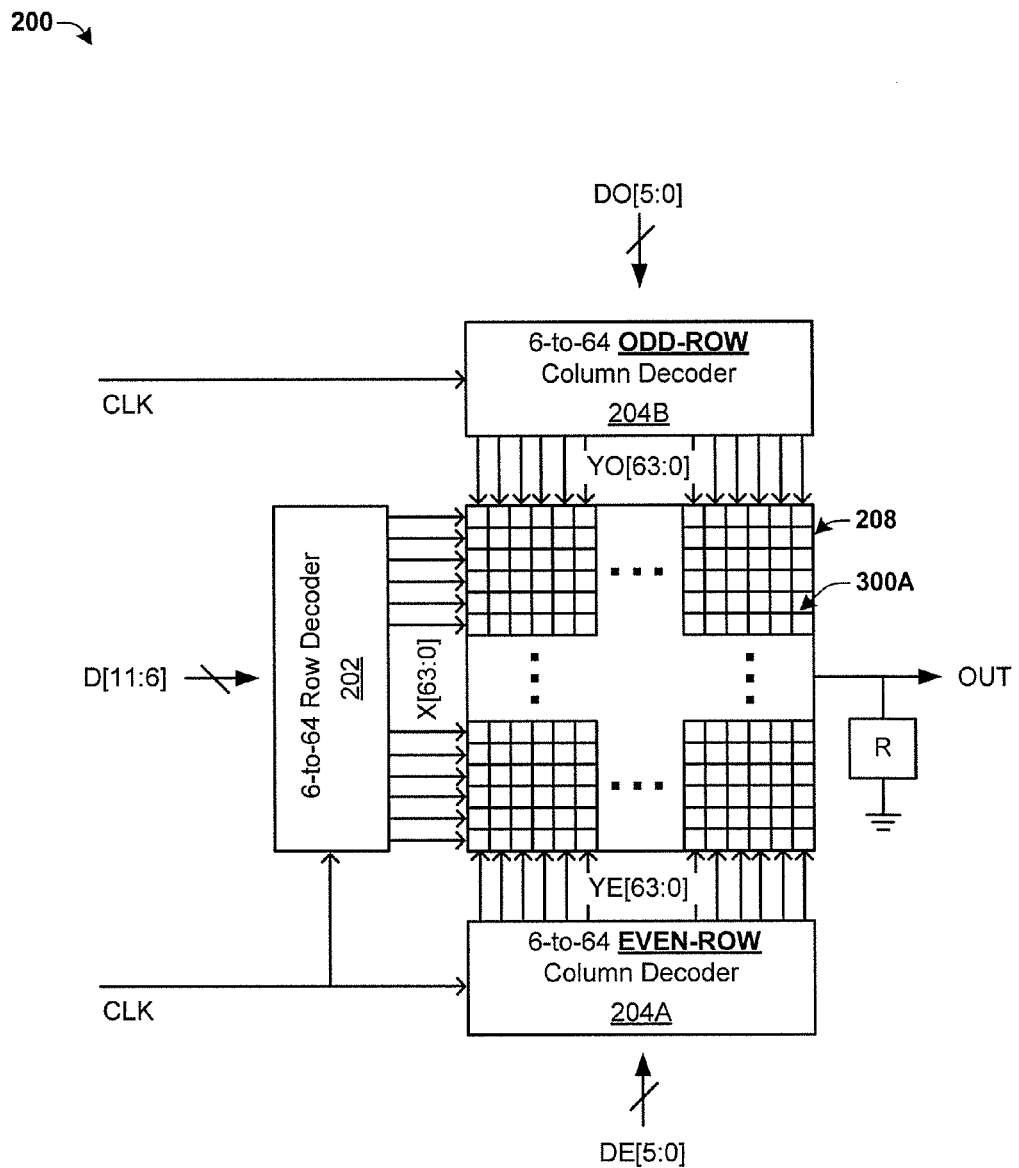
FIG. 2 illustrates some embodiments of a DAC comprising a row decoder, an even-row column decoder, and an odd-row column decoder.

FIG. 2 illustrates some embodiments of a DAC 200 comprising a row decoder 202, a first column decoder 204A, a second column decoder 204B, and a $2^{m/2} \times 2^{m/2}$ array 208 comprising $2^m$ unit cells 300A, where m=12, but in general may be any integer. The DAC 200 further comprises a current DAC, wherein a unit cell 300A further comprises a current unit cell configured to send a single unit of current when activated. The DAC 200 is configured to receive an m-bit (i.e., 12-bit) input digital signal D[11:0], and to parse D[11:0] into a most significant bit (MSB) signal D[11:6] comprising m/2 (i.e., 6) high-order bits, an odd-row least significant bit (LSB) signal DO[5:0] comprising m/2 odd low-order bits, and an even-row least significant bit (LSB) signal DE[5:0] comprising m/2 even low-order bits. The first column decoder 204A is configured to receive DE[5:0], the second column decoder 204B is configured to receive DO[5:0], and the row decoder 202 is configured to receive D[11:6].

The first column decoder 204A further comprises an m/2-to-$2^{m/2}$ (i.e., 6-to-64) thermal decoder configured to receive DE[5:0] and produce the first column control signal YE[63:0] further comprising $2^{m/2}$ (i.e., 64) thermal-encoded control bits. Likewise, the second column decoder 204B further comprises an m/2-to-$2^{m/2}$ thermal decoder configured to receive DO[5:0] and produce the second column control signal YO[63:0] further comprising $2^{m/2}$ thermal-encoded control bits. The row decoder 206 further comprises an m/2-to-$2^{m/2}$ thermal decoder configured to receive D[11:6] and produce the row control signal X[63:0] further comprising $2^{m/2}$ thermal-encoded control bits.

For the embodiments of DAC 200, a first subset of the unit cells 300A controlled by the first column decoder 204A comprises even rows of the array 208, and a second subset of the unit cells 300A controlled by the second column decoder 204B comprises odd rows of the array 208. As such, the second column decoder 204B comprises an "odd-row column decoder" configured to enable a second column control signal YO[63:0], or odd-row column control signal, for all unit cells 300A within a second row of the array 208 responsive to a CLK signal which controls timing of the DAC 200. Similarly, the first column decoder 204A comprises an "even-row column decoder" configured to enable a first column control signal YE[63:0], or even-row column control signal, for all unit cells 300A within a first row of the array 208 responsive to the CLK signal.

Figures 3A, 3B:
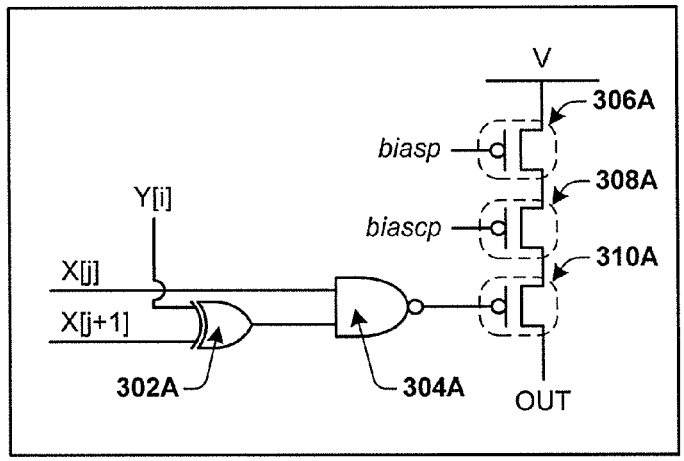
FIG. 3A illustrates some embodiments of a current unit cell of the DAC of FIG. 2.
FIG. 3B illustrates a truth table corresponding to the embodiments of FIG. 3A.

FIG. 3A illustrates some embodiments of a current unit cell 300A of the DAC 200. The unit cell 300A comprises a current unit cell further comprising OR-logic 302A configured to receive the $i^{th}$ column control signal Y[i] as the first input, and to receive the $(j+1)^{th}$ row control signal X[j+1] as a second input. The unit cell 300A further comprises NAND-logic 304A configured to receive the $j^{th}$ row control signal X[j] configured to control a $j^{th}$ row of unit cells within the array 208 as a first input, and an output of the OR-logic 302A as a second input. An output of the NAND-logic 304A is coupled to an output of the unit cell 300A. The output of the unit cell 300A is derived from a first p-type field-effect transistor (pFET) 306A comprising a first drain coupled to a voltage source (V), a first source, and a first gate coupled to a first bias control signal (biasp), a second pFET 308A comprising a second drain coupled to the first source, a second source, and a second gate coupled to a second bias control signal (biascp), and a third pFET 310A comprising a third drain coupled to the second source, a third source coupled to an output of the unit cell (OUT), and a third gate coupled to an output of the NAND-logic 304A. Thus, an output of the NAND-logic 304A comprising a value of 0 activates the unit cell 300A and allows a unit of current to be output, while an output of the NAND-logic 304A comprising a value of 1 deactivates the cell.

FIG. 3B illustrates a truth table 300B corresponding to the embodiments of unit cell 300A. As an example of cell activation, consider an exemplary embodiment wherein the $j^{th}$ row control signal X[j] for the j=0 (i.e., first) row of DAC 200 is made active. Therefore, X[0]=1, while X[1:63]=0 for the second through $64^{th}$ rows as they are left inactive. To bring the first cell 300A in the first row active, the first column control signal YE[0]=1, while YE[63:1]=0. In a "count-up" mode, unit cells 300A across the first row are consecutively turned on at consecutive clock edges of CLK signal by setting Y[1]=1 at a first clock edge, Y[2]=1 at a second clock edge, and so on until YE[63:0]=1 at a 64$^{th}$ clock edge. Once all of the unit cells 300A within the first row are active, a second row (i.e., (j+1)$^{th}$ row) control signal X[1] for the second row is enabled. The second row control signal X[1] acts as an assertion bit for the unit cells 300A within the first row, holding the unit cells 300A within the first row active in conjunction with X[0] regardless of the first input (Y[i:0]) comprising the first column control signal YE[63:0] or the second column control signal YO[63:0].

Figure 4A:
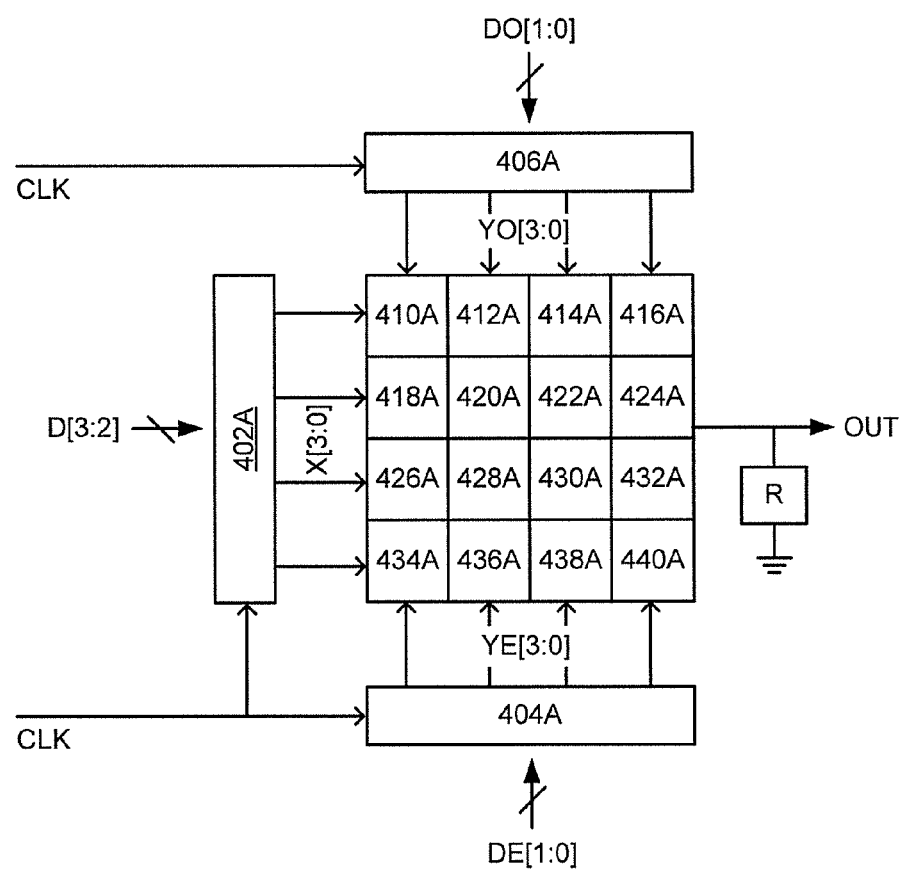
FIG. 4A illustrates some embodiments of a DAC comprising a row decoder, an even-row column decoder, and an odd-row column decoder to illustrate functionality.

FIG. 4A illustrates some embodiments of a current DAC 400A comprising a row decoder 402A, an even-row column decoder 404A, and an odd-row column decoder 406A to illustrate functionality. The current DAC 400A is configured to receive a 4-bit binary input digital signal D[3:0], whereupon an MSB signal D[3:2] is sent to the row decoder 402A further comprising a thermal decoder, and a first LSB signal DE[1:0] is sent to the even-row column decoder 404A, and a second LSB signal DO[1:0] is sent to the odd-row column decoder 406A, both also comprising thermal decoders. The current DAC 400A comprises a cell array 408A further comprising $2^4$=16 current unit cells 410A-440A, a respective current unit cell 410A-4440A comprising the current unit cell of the embodiments of FIG. 3A. The row decoder 402A, even-row column decoder 404A, and the odd-row column decoder provide thermometer encoded control signals, X[3:0], YE[3:0], and YO[3:0] respectively.

Figure 4B:
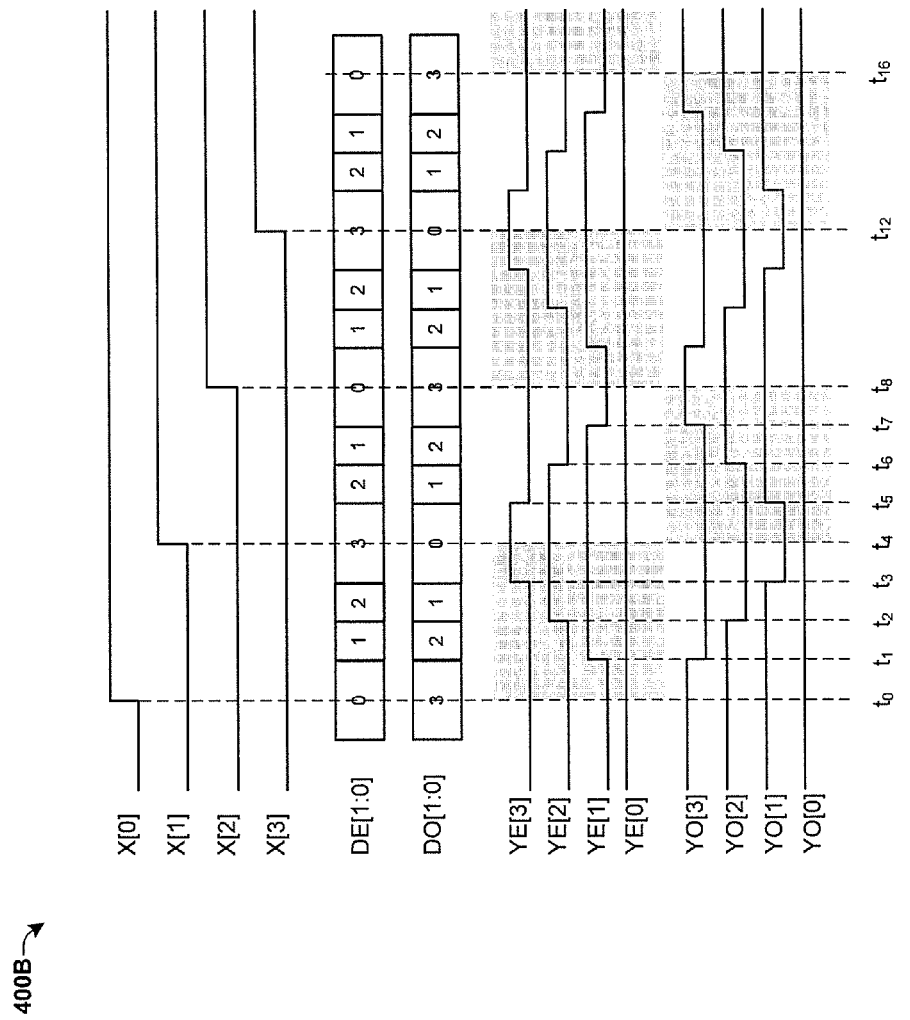
FIG. 4B illustrates some embodiments of a timing diagram corresponding to the DAC of FIG. 4A.

FIG. 4B illustrates some embodiments of a timing diagram 400B corresponding to the current DAC 400A. At $t_0$, a first row control signal X[0] corresponding to the first row (i.e., current unit cells 410A-416A) acquires a value of 1 and is sent from the row decoder 402A to the cell array 408A, whereupon the first row control signal X[0] is received by current unit cells 410A-416A. Also at $t_0$, odd thermometer control signals YO[3:0] corresponding to the columns of a second row (i.e., current unit cells 418A-424A) have a value of 1. Also at $t_o$, a first even-row column control signal YE[0] has a value of 1, and is sent from the even-row column decoder 404A to the cell array 408A, whereupon the first even-row column control signal YE[0] is received by current unit cells 410A and 426A. The first row control signal X[0] and the first even-row column control signal YE[0] both comprise a value of 1, activating current unit cell 410A in accordance with the truth table 300B. At $t_1$, a fourth odd-row column control signal YO[3] changes value from 1 to 0. Simultaneously at $t_1$, a second even-row column control signal YE[1] changes value from 0 to 1 (i.e., YE[1] is an inverse of YO[3]), and is sent from the even-row column decoder 404A to the cell array 408A, activating current unit cell 412A in combination with first row control signal X[0]. At $t_2$, a third odd-row column control signal YO[2] changes value from 1 to 0. Simultaneously at $t_2$, a third even-row column control signal YE[2] changes value from 0 to 1 (i.e., YE[2] is an inverse of YO[2]), and is sent from the even-row column decoder 404A to the cell array 408A, activating current unit cell 414A in combination with first row control signal X[0]. At $t_3$, a second odd-row column control signal YO[1] changes value from 1 to 0. Simultaneously at $t_3$, a fourth even-row column control signal YE[3] changes value from 0 to 1 (i.e., YE[3] is an inverse of YO[1]), and is sent from the even-row column decoder 404A to the cell array 408A, activating current unit cell 416A in combination with first row control signal X[0].

At $t_4$, a second row control signal X[1] corresponding to the second row (i.e., current unit cells 418A-424A) acquires a value of 1 and is sent from the row decoder 402A to the cell array 408A, whereupon the second row control signal X[1] is received by current unit cells 418A-424A, and by current unit cells 410A-416A. Also at $t_4$, odd thermometer control signals YO[3:0] and even thermometer control signals YE[3:0] maintain their respective values. As a result, a first odd-row column control signal YO[0] maintains a value of 1 and is sent from the odd-row column decoder 406A to the cell array 408A, whereupon the first odd-row column control signal YO[0] is received by current unit cells 418A and 434A. The second row control signal X[1] and the first odd-row column control signal YO[0] both comprise a value of 1, activating current unit cell 418A in accordance with the truth table 300B. Note that current unit cells 410A-416A are held active regardless of the even thermometer control signals YE[3:0] as both X[0] and X[1] maintain values of 1, in accordance with truth table 300B.

At $t_5$, the fourth even-row column control signal YE[3] changes value from 1 to 0. Simultaneously at $t_5$, the second odd-row column control signal YO[1] changes value from 0 to 1, because YE[1] is the inverse of YO[3]. Thus at $t_5$, the second row control signal X[1] and the second odd-row column control signal YO[1] both comprise a value of 1, activating current unit cell 420A in accordance with the truth table 300B. At $t_6$, the third even-row column control signal YE[2] changes value from 1 to 0. Simultaneously at $t_6$, the third odd-row column control signal YO[2] changes value from 0 to 1, because YE[2] is the inverse of YO[2]. Thus at $t_6$, the second row control signal X[1] and the third odd-row column control signal YO[2] both comprise a value of 1, activating current unit cell 422A in accordance with the truth table 300B. At $t_7$, the second even-row column control signal YE[1] changes value from 1 to 0. Simultaneously at $t_7$, the fourth odd-row column control signal YO[3] changes value from 0 to 1, because YE[1] is the inverse of YO[3]. Thus at $t_7$, the second row control signal X[1] and the fourth odd-row column control signal YO[3] both comprise a value of 1, activating current unit cell 424A in accordance with the truth table 300B.

At $t_8$, a third row control signal X[2] corresponding to the third row (i.e., current unit cells 426A-432A) acquires a value of 1 and is sent from the row decoder 402A to the cell array 408A, whereupon the third row control signal X[2] is received by current unit cells 426A-432A. Note that the values of the odd thermometer control signals YO[3:0] and the even thermometer control signals YE[3:0] have identical respective values at $t_0$ and $t_8$, with only the row control signals X[3:0] corresponding to the respective rows differing. As a result, from $t_8$ to $t_{16}$ the unit cell activation process repeats for the third row and a fourth row (i.e., current unit cells 434A-440A) in an analogous fashion to that of the first row and second row from $t_0$ to $t_8$, with the third row, or active row, "counting up" in a manner analogous to that described for the first row from $t_0$ to $t_4$, and the fourth row, or passive row, "counting down" in a manner analogous to that described for the second row from $t_0$ to $t_4$. From $t_{12}$-$t_{16}$ the fourth row "counts up" analogous to the second row from $t_4$ to $t_8$.

In some embodiments, YE[3:1] are determined as the logical inverse of respective odd thermometer control signals YO[1:3] for ease of implementation. As these control signals are derived from the 4-bit binary input digital signal D[3:0], and derived MSB signal D[3:2], first LSB signal DO[1:0], and second LSB signal DE[1:0]. In general, for a given logical operation as is shown in the embodiments of truth table 300B, an inverse control vector can be achieved by inverting a control signal from which the control vector we derived for a given combinatorial logic operation.

Figures 5A, 5B:
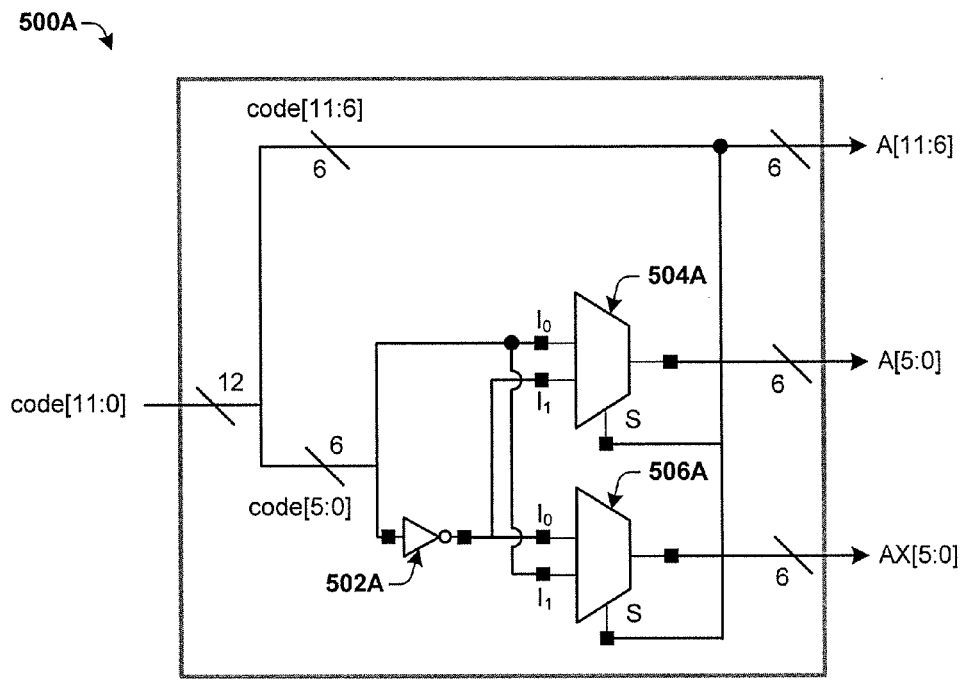
FIG. 5A illustrates some embodiments of a timing encoder corresponding to the DAC of FIG. 2.
FIG. 5B illustrates a truth table corresponding to a multiplexer within the timing encoder of FIG. 5A.

FIG. 5A illustrates some embodiments of a timing encoder 500A corresponding to the DAC 200. The timing encoder 500A is configured to derive the second column control signal YO[63:0] from an inverted first column control signal YE[63:

0] with one or more logical operations. In general, the timing encoder 500A is configured to receive an m-bit input digital signal code[11:0], to bisect code[11:0] into the MSB signal code [11:6] and the LSB signal code[5:0], and to invert code [5:0] to produce an inverted LSB signal with an inverter 502A. A first output signal A[11:6] of the timing encoder 500A is derived from code[11:6] as a direct copy, and comprises the row control signal. A second output signal A[5:0] of the timing encoder 500A is derived from code[5:0] by a first multiplexer 504A which receives the LSB signal as a first input $I_0$, receives the inverted LSB signal as a second input $I_1$, selects between them with a selection switch S which is coupled to code[11:6], and operates in accordance with truth table 500B of FIG. 5B. Note that because $I_0$ is the inverse of $I_1$, these two inputs can never be equal. The second output signal A[5:0] comprises first column control signal, which is derived from the LSB signal code[5:0]. In a similar manner, a second multiplexer 506A is configured to receive the inverted LSB signal as a first input $I_0$ and the LSB signal code[5:0] as a second input $I_1$, and to output the second column control signal AX[5:0], AX[5:0] comprising an inverse of A[5:0]. The second multiplexer 506A further comprises a selection switch S coupled to the MSB signal code[11:6], and outputs the second column control signal AX[5:0] in accordance with the truth table 500B.

Timing encoder 500A outputs the row control signal A[11: 6], the first column control signal A[5:0] controlling even rows of DAC 200, and the second column control signal AX[5:0] controlling odd rows of DAC 200, on a common clock edge. Timing encoder 500A features a one-to-one mapping between output voltage and input digital signal code[11: 0], comprises no code dependency on previous code or counting direction, and produces an instantaneous response to input digital signal code[11:0] while requiring no counter.

Figure 5C:
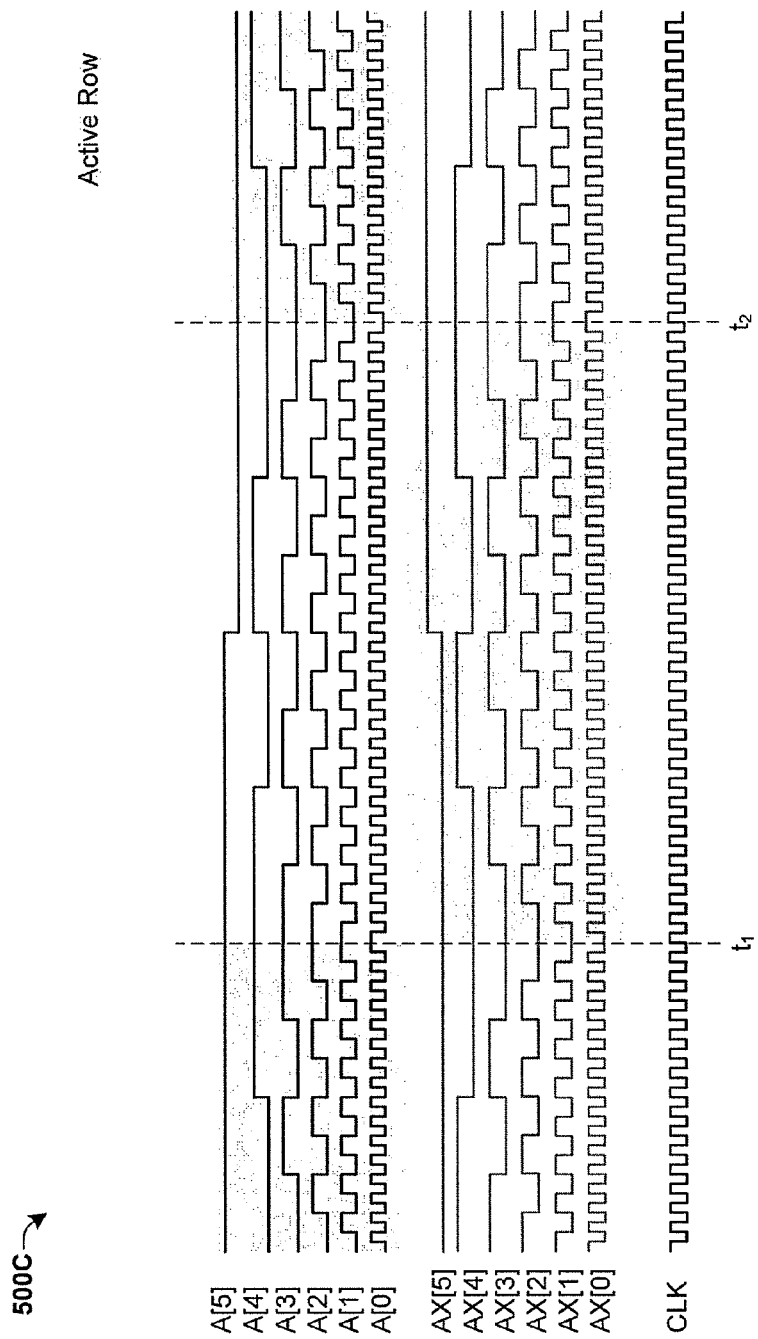
FIG. 5C illustrates a count-up timing diagram corresponding to the embodiments of FIGS. 2-5B.
Figure 5D:
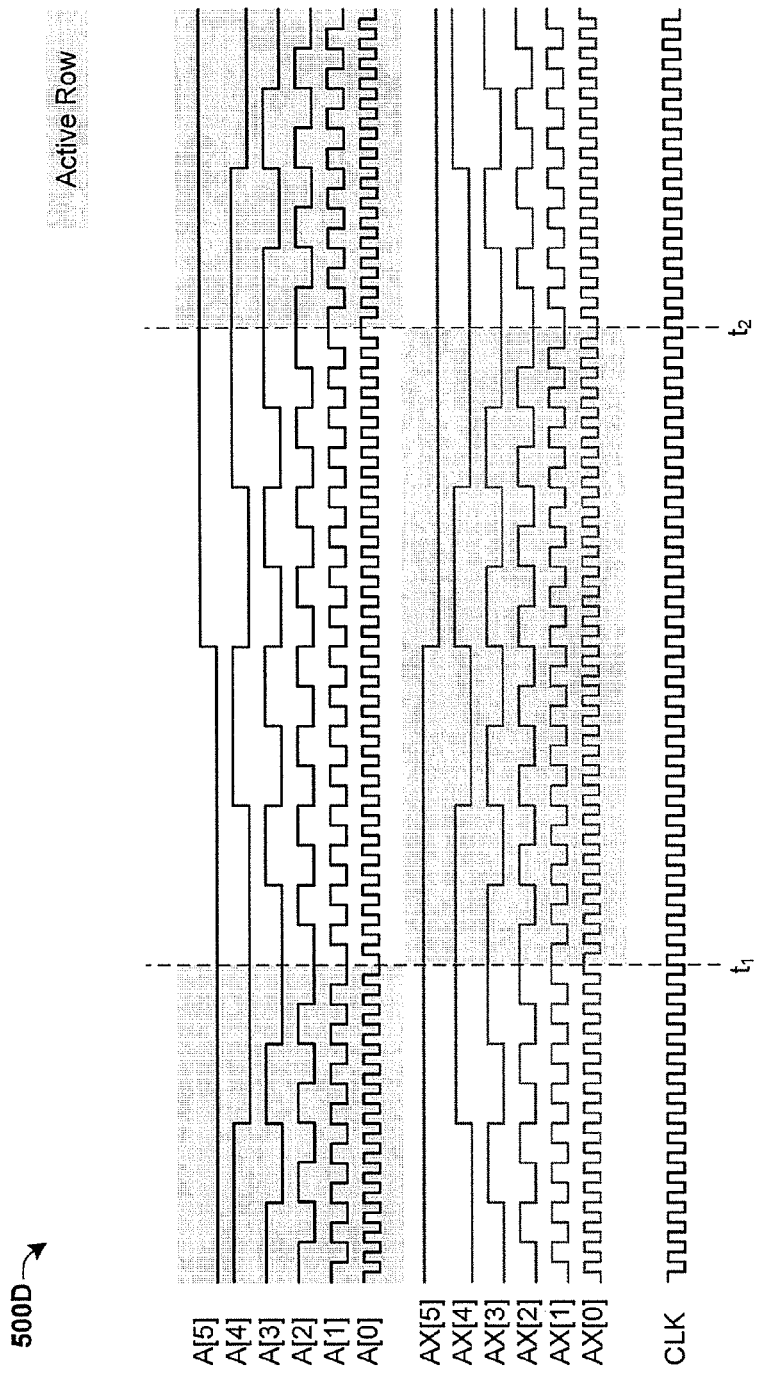
FIG. 5D illustrates a count-down timing diagram corresponding to the embodiments of FIGS. 2-5B.

FIG. 5C illustrates a count-up timing diagram 500C corresponding to the embodiments of FIGS. 2-5B, which eliminates any transient glitch due to column control switching at a row address change. At $t_1$, a first row is made inactive and a second row is made active through the row control signal A[11:6] (not shown). The columns of the first row (and third row, and fifth row, etc.) are controlled by the first column control signal A[5:0]. For the embodiments of FIG. 5C, the first row comprises an even row, and the first column control signal A[5:0] comprises an even-row column control signal. Therefore, the second row (and fourth row, and sixth row, etc.) comprises an odd row and is controlled by the second column control signal AX[5:0] comprising an odd-row column control signal. At $t_1$ the odd-row column control signal AX[5:0] comprises a value of 000000, while the even-row column control signal A[5:0] comprises a value of 111111. The column addresses of the (odd) columns within the (active) second row are counted up on consecutive edges of the CLK signal, while the column addresses of the (even) columns within the (idle) first row, and idle third row (not shown, but is the next row to be activated) are counted down on consecutive edges of the CLK signal to return the idle third row an initial state (i.e., 000000) of active row at $t_2$. Therefore, for "count-up" of an active row, the initial state is: all column addresses=0, and for "count-down" of an idle row, the initial state is: all column addresses=1. FIG. 5D illustrates a count-down timing diagram 500D corresponding to the embodiments of FIGS. 2-5B, which operates in a fashion analogous to the count-up timing diagram 500C, wherein the initial state of the active row is: all column addresses=1, and the initial state of the idle row is: all column addresses=0.

Figure 6:
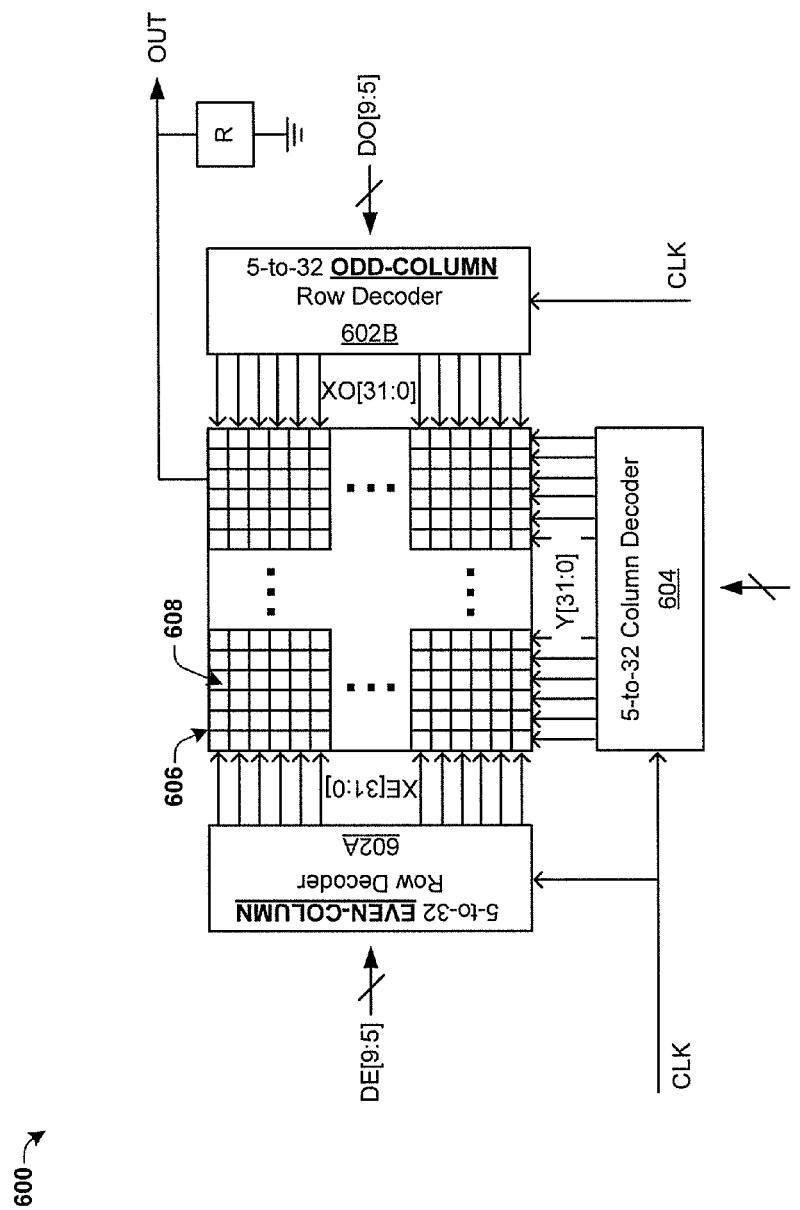
FIG. 6 illustrates some embodiments of a DAC comprising an even-column row decoder, an odd-column row decoder, and a column decoder.

FIG. 6 illustrates some embodiments of a current DAC 600 comprising an even-column row decoder 602A, an odd-column row decoder 602B, a column decoder 604, and an array 606 comprising $2^m$ current unit cells 608, and configured to receive an m-bit input digital signal (i.e., m=10) D[9:0]. The column decoder 604 further comprises an m/2-to-$2^{m/2}$ (i.e., 5-to-32) thermal decoder configured to control the $2^m$ (i.e., 1,024) current unit cells with a column control signal Y[31:0] further comprising $2^{m/2}$ (i.e., 32) thermal-encoded control bits. The even-column row decoder 602A further comprises an m/2-to-$2^{m/2}$ thermal decoder configured to control a even columns of the $2^m$ current unit cells 608 with a first row control signal XE[31:0] further comprising $2^{m/2}$ thermal-encoded control bits, an even column comprising a column controlled by a first MSB signal DE[9:5]. The second row decoder 604B further comprises an m/2-to-$2^{m/2}$ thermal decoder configured to control a odd columns of the $2^m$ current unit cells 608 with a second row control signal XO[31:0] further comprising $2^{m/2}$ thermal-encoded control bits, an odd column comprising a column controlled by a second MSB signal DO[9:5].

For the embodiments of current DAC 600, a current unit cell 608 further comprises combinatorial logic configured to receive the first row control signal XE[31:0] as a first input or the second row control signal XO[31:0] as the first input and the column control signal as a second input Y[31:0]. The current unit cell 608 produces an output comprising one or more logical operations on the first input and the second input by the combinatorial logic, and derives an assertion bit from the first input or the second input, wherein the assertion bit is configured to hold the combinatorial logic active if the first input or the second input changes, allowing for current DAC 600 to count-up within active columns and count-down within idle columns in a manner analogous to the embodiments of FIG. 2-5D. The second row decoder 604B is configured to set all odd-column row control signals corresponding to odd columns of unit cells 608 within the array 606 to active. The even-column row decoder 602A is configured to consecutively activate unit cells 608 within an even-numbered column of the array 606 by activating a respective unit cell 608 with a column control signal Y[31:0] and an even-column row control signal XE[31:1] corresponding to a row of a respective unit cell 608 in the even-numbered column. The odd-column row decoder 602B is configured to consecutively disable an odd-column row control signal XO[31:0] when a unit cell 608 within the even-numbered column is activated.

In some embodiments, the current DAC 600 further comprises a timing encoder (500A) configured to bisect the m-bit input digital signal D[9:0] into a first MSB signal DE[9:5] comprising m/2 even high-order bits, a second MSB signal DO[9:5] comprising m/2 odd high-order bits, and an LSB signal D[4:0] comprising m/2 low-order bits. The timing encoder is further configured to invert the MSB signal to produce an inverted MSB signal, derive XE[31:0] from the MSB signal, derive XO[31:0] from the inverted MSB signal, and derive Y[63:0] from the LSB signal.

Figure 7:
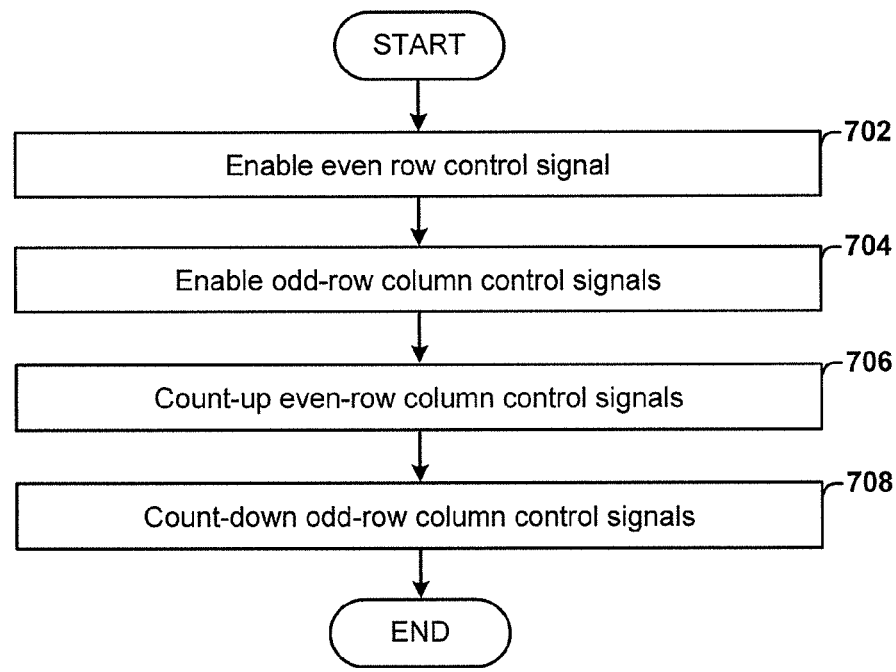
FIG. 7 illustrates some embodiments of a method of count-up control signal enablement in a first row of a DAC and simultaneously count-down cell control signal disablement in a second row of the DAC.
Figure 8:
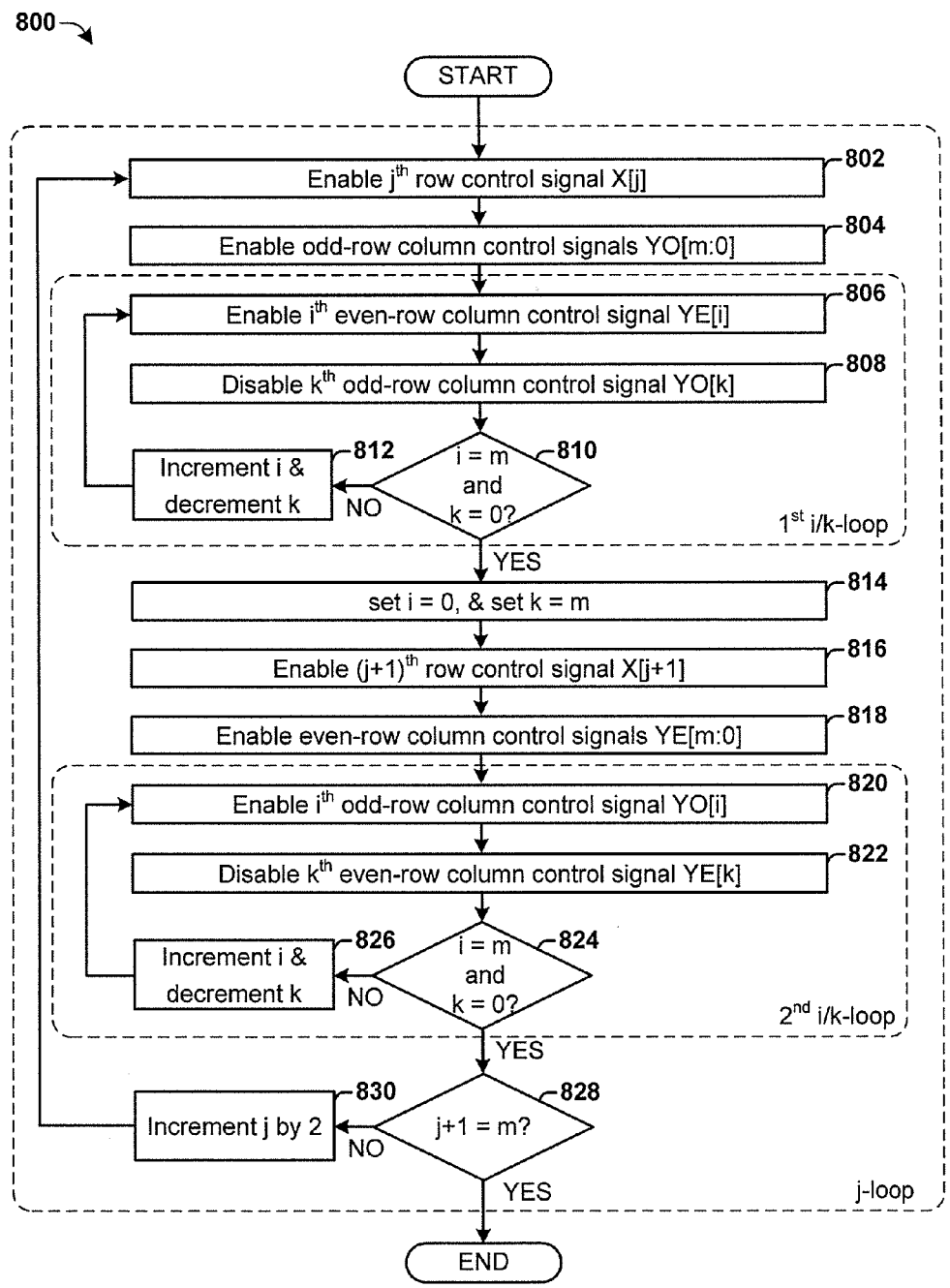
FIG. 8 illustrates some embodiments of a method to decode a digital control signal for a DAC comprising a row decoder, an even-row column decoder, and an odd-row column decoder.

FIGS. 7-8 illustrate some embodiments of methods to decode a digital control signal for a DAC comprising a row decoder, an even-row column decoder, and an odd-row column decoder, and to activate the unit cells within the array. While the methods disclosed in FIGS. 7-8 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 7 illustrates some embodiments of a method 700 of count-up control signal enablement in a first row of a DAC and simultaneously count-down cell control signal disablement in a second row of the DAC.

At 702 a first row control signal is enabled, the first row control signal is configured to control a first row of unit cells within the array, wherein the first row is an even row, and wherein the first row control signal and an even-row column control signal can collectively activate a unit cell within the first row.

At 704 all odd-row column control signals corresponding to odd rows of unit cells within the array are enabled, wherein a second row control signal and the odd-row column control signal can collectively activate a unit cell within the second row.

At 706 a count-up of the even row column control signals is performed, wherein unit cells within the first row of the array are consecutively activated through the row control signal and the even-row column control signal.

At 708 a count-down of the odd row column control signals is performed simultaneously to 706, wherein an odd-row column control signal is (consecutively) disabled when a unit cell within the even-numbered row is activated.

FIG. 8 illustrates some embodiments of a method 800 to decode a digital control signal for a DAC comprising a $2^{m/2} \times 2^{m/2}$ array of unit cells, a row decoder, an even-row column decoder, and an odd-row column decoder.

At 802 a $j^{th}$ row of the array is enabled with a control signal X[j], wherein the $j^{th}$ row further comprises an even-numbered row, and wherein the $j^{th}$ row control signal and an even-row column control signal YE[0:m] can collectively activate a unit cell within the $j^{th}$ row, and wherein j is an index between 0 and m. For a first iteration of method 800 in a j-loop, j=0 corresponding to the first row.

At 804 odd-row column control signals YO[0:m] are enabled, YO[0:m] configured to control odd-numbered rows of unit cells within the array.

At 806 an $i^{th}$ even-row column control signal YE[i] of even-row column control signals YE[0:m] is enabled, YE[i] configured to enable a unit cell in row j and column i of the array, wherein i is an index between 0 and m. For a first iteration of method 800 in a first i/k-loop, i=0 corresponding to the first unit cell in a respective even row (i.e., the first cell in the first row).

At 808 a $k^{th}$ odd-row column control signal YO[k] is disabled, wherein k is an index between 0 and m. For the first iteration of method 800 in the first i/k-loop, k=m corresponding to the last unit cell in an odd-row (i.e., the last cell in the second row).

At 810 indices m and k are checked to see if i=m and if k=0. When this condition is met. The last cell on the even (active) row has been activated by YE[m], and the first cell in the odd (idle) row has been deactivated by YO[0], and the method 800 moves to the next row.

At 812 if i≠m and if k≠0, then i is incremented by 1, and k is decremented by 1, and method 800 returns to 806, wherein a next iteration in the first i/k-loop is performed comprising repeated enabling of YE[i], repeated disabling of YO[k], and repeated incrementing of i and decrementing of k, performing subsequent iterations until the condition i=m and if k=0 is achieved, wherein a maximum number of iteration is less than or equal to m.

At 814 indices i and k are set such that i=0 and k=m.

At 816 a $(j+1)^{th}$ row of unit cells is activated by enabling a $(j+1)^{th}$ row control signal X[j+1]. For the first iteration of method 800 in the j-loop, j+1=1 corresponding to the second row.

At 818 YE[0:m] is enabled, YE[0:m] configured to control even-numbered rows of unit cells within the array (i.e., a third row).

At 820 an $i^{th}$ odd-row column control signal YO[i] configured to enable a unit cell in row j+1 and column i of the array is enabled. For a first iteration of method 800 in a second i/k-loop, i=0 corresponding to the first unit cell in the second row.

At 822 a $k^{th}$ even-row column control signal YE[k] is disabled. For the first iteration of method 800 in the second i/k-loop, k=m corresponding to the last unit cell in an even-row.

At 824 indices m and k are checked to see if i=m and if k=0.

At 826 if i≠m and if k≠0, then i is incremented by 1, and k is decremented by 1, and method 800 returns to 820, wherein a next iteration in the second i/k-loop is performed comprising repeated enabling of YO[i], repeated disabling of YE[k], and repeated incrementing of i and decrementing of k is performed until the condition i=m and if k=0 is achieved.

At 828 index j is checked to see if j+1=m.

At 830 if j+1≠m, then j is incremented by 2 and method 800 returns to 802 to perform a next iteration in a j-loop by enabling a $j^{th}$ row control signal X[j] (i.e., X[2]).

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, present disclosure relates to a method and architecture to minimize a transient glitch within a current digital-to-analog converter (DAC) comprising an array of identical current unit cells. The current DAC is configured with individual column decoders for even and odd rows of current unit cells, thus allowing for independent control of adjacent rows. The even row and odd row column decoders further comprise thermal decoders with coupled timing encoding which establishes synergy between an adjacent pair of rows. As current units cells within an active row are activated across the row by a counting up of a first column decoder, the current units cells within a next row adjacent the active row are returned to an initial state of the active row by counting down in a second column decoder. Other devices and methods are also disclosed.

In some embodiments, the present disclosure relates to a digital-to-analog converter (DAC), comprising an array comprising a plurality of unit cells, an even-row column decoder configured to control a even rows of the array with an even-row column control signal, a second column decoder configured to control a odd rows of the array with an odd-row column control signal, and a row decoder configured to control the plurality of current cells with a row control signal, wherein a unit cell of the plurality of unit cells is activated by the even-row column control signal and the row control signal or the odd-row column control signal and the row control signal.

In some embodiments, the present disclosure relates to a current DAC, comprising an array comprising $2^m$ current unit cells and configured to receive an m-bit input digital signal, a column decoder further comprising an m/2-to-$2^{m/2}$ thermal decoder configured to control the $2^m$ current unit cells with a column control signal further comprising $2^{m12}$ thermal-encoded control bits, a first row decoder further comprising an m/2-to-$2^{m/2}$ thermal decoder configured to control a first subset of the $2^m$ current unit cells with a first row control signal further comprising $2^{m/2}$ thermal-encoded control bits, and a second row decoder further comprising an m/2-to-$2^{m/2}$ thermal decoder configured to control a second subset of the $2^m$ current unit cells with a second row control signal further comprising $2^{m/2}$ thermal-encoded control bits. A current unit cell is activated by the column control signal and the first row control signal or the column control signal and the second row control signal, and the current unit cell is configured to send a single unit of current when activated by thermally-encoded control bits.

In some embodiments, the present disclosure relates to a method to control cell activation within a DAC comprising an array of unit cells, wherein all odd-row column control signals corresponding to odd rows of unit cells within the array are enabled, unit cells within an even-numbered row of the array are consecutively activated by activating a respective unit cell with a row control signal and an even-row column control signal corresponding to a column of a respective unit cell in the even-numbered row, while simultaneously and consecutively disabling an odd-row column control signal when a unit cell within the even-numbered row is activated.

What is claimed is:

1. A digital-to-analog converter (DAC), comprising:
an array comprising $2^m$ unit cells;
a timing encoder configured to bisect an m-bit input digital signal into a most significant bit (MSB) signal comprising m/2 high-order bits, and a least significant bit (LSB) signal comprising m/2 low-order bits;
a first column decoder configured to control a first subset of the $2^m$ unit cells with a first column control signal derived from the LSB signal;
a second column decoder configured to control a second subset of the $2^m$ unit cells with a second column control signal derived from the LSB signal; and
a row decoder configured to control the $2^m$ unit cells with a row control signal derived from the MSB signal;
wherein a unit cell of the $2^m$ unit cells is activated by the first column control signal and the row control signal or the second column control signal and the row control signal.

2. The DAC of claim 1, wherein one or more of the $2^m$ unit cells comprise a current unit cell configured to send a single unit of current when activated.

3. The DAC of claim 1, wherein:
the first column decoder further comprises a first m/2-to-$2^{m/2}$ thermal decoder configured to receive the LSB signal and produce the first column control signal further comprising a first plurality of $2^{m/2}$ thermal-encoded control bits;

the second column decoder further comprises a second m/2-to-$2^{m/2}$ thermal decoder configured to receive an inverted LSB signal and produce the second column control signal further comprising a second plurality of $2^{m/2}$ thermal-encoded control bits; and
the row decoder further comprises a third m/2-to-$2^{m/2}$ thermal decoder configured to receive the MSB signal and produce the row control signal further comprising a third plurality of $2^{m/2}$ thermal-encoded control bits.

4. The DAC of claim 3, wherein:
the first subset of the $2^m$ unit cells comprises even rows of the DAC; and
the second subset of the $2^m$ unit cells comprises odd rows of the DAC.

5. The DAC of claim 4, wherein the timing encoder is further configured to derive the second column control signal from an inverted first column control signal with one or more logical operations.

6. The DAC of claim 5, wherein the timing encoder is further configured to:
receive the m-bit input digital signal;
bisect the m-bit input digital signal into the MSB signal and the LSB signal;
invert the LSB signal to produce the inverted LSB signal;
derive the row control signal from the MSB signal;
derive the first column control signal from the LSB signal;
derive the second column control signal from the inverted LSB signal; and
output the row control signal, the first column control signal, and the second column control signal on a common clock edge.

7. The DAC of claim 6, the timing encoder further comprising:
an inverter configured to receive the LSB signal and output the inverted LSB signal;
a first multiplexer configured to receive the LSB signal and the inverted LSB signal, and to output the first column control signal, wherein a selection switch of the first multiplexer is coupled to the MSB signal; and
a second multiplexer configured to receive the inverted LSB signal and the LSB signal, and to output the second column control signal, wherein a selection switch of the second multiplexer is coupled to the MSB signal.

8. The DAC of claim 7, wherein one or more of the $2^m$ unit cells located within a $j^{th}$ row of the array comprises:
OR-logic configured to receive the first column control signal as a first input or the second column control signal as the first input, and to receive a $(j+1)^{th}$ row control signal as a second input; and
NAND-logic configured to receive a $j^{th}$ row control signal as a first input and an output of the OR-logic as a second input;
wherein an output of the NAND-logic is coupled to an output of the one or more of the $2^m$ unit cell.

9. The DAC of claim 8, wherein:
the second column decoder is configured to enable the second column control signal for all unit cells within a second row of the array at a first clock edge;
the first column decoder is configured to activate a first unit cell within a first row of the array at the first clock edge, activate a second unit cell within the first row of the array at a second clock edge, and so on, until all unit cells within the first row of the array are activated at an $(2^{m/2})^{th}$ clock edge; and
the second column decoder is configured to disable an $(2^{m/2})^{th}$ control signal controlling an $(2^{m/2})^{th}$ unit cell within the second row at the second clock edge, disable an $(2^{m/2}-1)^{th}$ control signal controlling an $(2^{th/2}-1)^{th}$ unit cell within the second row of the array at a third clock edge, and so on, until the second column control signal is enabled for none of the unit cells within the second row of the array are activated at an $(2^{m/2})^{th}$ clock edge.

10. A current digital-to-analog converter (DAC) configured to receive an m-bit input digital signal, comprising:
an array comprising $2^m$ current unit cells;
a column decoder further comprising a first m/2-to-$2^{m/2}$ thermal decoder configured to control the $2^m$ current unit cells with a column control signal further comprising a first plurality of $2^{m/2}$ thermal-encoded control bits;
a first row decoder further comprising a second m/2-to-$2^{m/2}$ thermal decoder configured to control a first subset of the $2^m$ current unit cells with a first row control signal further comprising a second plurality of $2^{m/2}$ thermal-encoded control bits;
a second row decoder further comprising a third m/2-to-$2^{m/2}$ thermal decoder configured to control a second subset of the $2^m$ current unit cells with a second row control signal further comprising a third plurality of $2^{m/2}$ thermal-encoded control bits; and
wherein a current unit cell of the $2^m$ current unit cells is activated by the column control signal and the first row control signal or the column control signal and the second row control signal, and
wherein the current unit cell of the $2^m$ current unit cells is configured to send a single unit of current when activated.

11. The current DAC of claim 10, further comprising a timing encoder configured to derive the second row control signal from an inverted first row control signal with one or more logical operations.

12. The current DAC of claim 11, the timing encoder further configured to bisect the m-bit input digital signal into a most significant bit (MSB) signal comprising m/2 high-order bits, and a least significant bit (LSB) signal comprising m/2 low-order bits, wherein the column decoder is configured to receive the LSB signal, and wherein the first row decoder is configured to receive the MSB signal, and the second row decoder is configured to receive an inverted MSB signal.

13. The current DAC of claim 12, wherein the timing encoder is further configured to:
invert the MSB signal to produce the inverted MSB signal;
derive the first row control signal from the MSB signal;
derive the second row control signal from the inverted MSB signal;
derive the column control signal from the LSB signal; and
output the first row control signal, the second row control signal, and the column control signal on a common clock edge.

14. The current DAC of claim 13, wherein:
the first subset of the $2^m$ current unit cells comprises even columns of the current DAC, an even column controlled by an even-numbered thermal-encoded control bit of the LSB signal; and
the second subset of the $2^m$ current unit cells comprises odd columns of the current DAC, an odd column controlled by an odd-numbered thermal-encoded control bit of the LSB signal.

15. The current DAC of claim 14, wherein one of the $2^m$ current unit cells further comprises combinatorial logic configured to:

receive the first row control signal as a first input or the second row control signal as the first input and the column control signal as a second input;
produce an output of the one of the $2^m$ current unit cells comprising one or more logical operations on the first input and the second input by the combinatorial logic; and
derive an assertion bit from the first input or the second input, wherein the assertion bit is configured to hold the combinatorial logic active if the first input or the second input changes.

16. The current DAC of claim 15, wherein:
the second row decoder is configured to set all odd-column row control signals corresponding to odd columns of the $2^m$ current unit cells within the array to active;
the first row decoder is configured to consecutively activate current unit cells within an even-numbered column of the array by activating a respective current unit cell with the column control signal and an even-column row control signal corresponding to a row of the respective current unit cell in the even-numbered column; and
the second row decoder is configured to consecutively disable an odd-column row control signal when the current unit cells within the even-numbered column is activated.

17. A method of unit cell activation within a digital-to-analog converter (DAC), comprising:
enabling a second row control signal and second-row column control signals corresponding to a second row of unit cells within the DAC, wherein the second-row control signal and the second-row column control signals collectively activate the unit cells within the second row;
enabling a first-row control signal; and
de-enabling one of the second-row column control signals upon enabling a first-row column control signal, wherein the first-row column control signal and the first-row column control signal collectively activate a unit cell within the first row.

18. The method of claim 17, further comprising:
counting-up of first-row column control signals on consecutive clock edges to consecutively activate successive unit cells within the first row; and
counting-down of second-row column control signals on the consecutive clock edges which consecutively deactivate successive unit cells within the second row.

19. The method of claim 18, whereupon completion of counting down of the second-row column control signals such that all unit cells within the second row are deactivated at a first clock edge, a first unit cell within the second row is activated at a second clock edge, where after successive unit cells within the second row are activated on subsequent consecutive clock edges.

20. The method of claim 17, further comprising:
bisecting an m-bit input digital signal into a most significant bit (MSB) signal comprising m/2 high-order bits, and a least significant bit (LSB) signal comprising m/2 low-order bits;
deriving the first-row column control signal from the LSB signal;
deriving the second-row column control signals from an inverted LSB signal; and
deriving the first and second row control signals from the MSB signal.

* * * * *